United States Patent [19]
Mahant-Shetti et al.

[11] Patent Number: 5,612,632
[45] Date of Patent: Mar. 18, 1997

[54] HIGH SPEED FLIP-FLOP FOR GATE ARRAY

[75] Inventors: Shivaling Mahant-Shetti, Los Angeles, Calif.; Kevin Ovens, Plano, Tex.; Clive Bittlestone, Allen, Tex.; Robert C. Martin, Dallas, Tex.; Robert J. Landers, Plano, Tex.

[73] Assignee: Texas Instruments Incorporated, Dallas, Tex.

[21] Appl. No.: 346,562

[22] Filed: Nov. 29, 1994

[51] Int. Cl.⁶ .................. H03K 19/173; H03K 19/00
[52] U.S. Cl. .................. 326/46; 327/203; 326/93
[58] Field of Search .................. 326/46, 40, 93, 326/95; 327/202, 203, 210, 211, 212

[56] References Cited

U.S. PATENT DOCUMENTS

| | | | |
|---|---|---|---|
| 5,105,100 | 4/1992 | Yamada | 327/203 |
| 5,107,137 | 4/1992 | Kinugasa et al. | 327/203 |
| 5,173,626 | 12/1992 | Kudou et al. | 326/46 |
| 5,317,205 | 5/1994 | Sato | 327/203 |

*Primary Examiner*—Edward P. Westin
*Assistant Examiner*—Richard Roseen
*Attorney, Agent, or Firm*—Ira S. Matsil; Robby T. Holland; Richard L. Donaldson

[57] ABSTRACT

A flip-flop includes a data storage node for driving an inverter (62) and transfer gate (64) combination to transfer data stored on the data node (60) to a master storage node (66). A master cross-coupled latch (68) has two cross-coupled inverters (72) and (74) connected thereto such that the master storage node (66) is only connected to one side of the latch (68). The data node (66) directly drives a slave stage comprised of an inverter (76) and transfer gate (78) which in turn drives a slave storage node (80). The slave storage node (80) is connected to a slave cross-coupled latch (82) comprised of cross-coupled inverters (86) and (88). The slave storage node (80) comprises the Q-output of the inverter. The data is transferred to storage node (66) on the negative going edge of the clock signal and latched thereto on the positive going edge of the clock signal. ON the positive going edge of the clock signal, data is transferred from the storage node (66) to the slave storage node (80) and then latched in the latch (82) on the negative going edge of the clock signal. This results in a minimum number of inverters, thus decreasing the Clock-to-Q time.

27 Claims, 2 Drawing Sheets

HIGH SPEED FLIP-FLOP FOR GATE ARRAY

TECHNICAL FIELD OF THE INVENTION

The present invention pertains in general to flip-flops, and more particularly, to a high speed flip-flop for use with a gate array.

CROSS REFERENCE TO RELATED APPLICATIONS

This application relates to U.S. Pat. No. 5,250,852, issued Oct. 5, 1993 to the present assignee, which U.S. Patent is incorporated herein by reference.

BACKGROUND OF THE INVENTION

A clocked flip-flop utilizes sequential logic to selectively latch one of two binary states, a logic "0" or a logic "1". Typical flip-flops of this type use a master and a slave section with the master section initially clocked on one edge of a clock signal to store the logic state on a master node and then, on the next edge of the clock, transfer this logic state to a slave node for storage therein. In this manner, on the next clock cycle, another logic state can be stored in the master node without affecting the slave node. These changes in the "latched" logic states are a function of the clock and the input data.

A typical D-flip-flop provides on the output a Q-output and a Q-Bar output. One measure of the speed of these flip-flops is the "clock-to-Q" time for the output Q to assume the logic state equal to the logic state of the data input, in response to the a transition of the clock signal. The delay between the time the data is input and the time that the Q-output is valid is a function of the amount of delay inherent in the internal structure of the flip-flop. This delay is due to the incorporation of such things as inverter circuits and transfer gates that are required to realize the various latch circuits and clock circuits internal to the flip-flop. It is desirable to not only reduce the number of components required to realize a flip-flop, but also to minimize the number of logic circuits required in the sequential configuration utilized in the flip-flop.

SUMMARY OF THE INVENTION

The present invention disclosed and claimed herein comprises sequential circuitry for latching a logic state in response to transitions in a clock signal. The circuitry includes an input node for inputting an input signal which is then input to a first transfer circuit. The first transfer circuit is operable to output a master logic signal that is indicative of the logic state of the input signal in response to a first transition of the clock signal, the master logic signal output to a master storage node. A master latch is operable to latch the master logic state to the master storage node. A second transfer circuit has the input thereof coupled to the master storage node and is operable to output a slave logic state representative of the master logic state in response to a second transition of the clock signal, the slave logic state output to a slave storage node. A slave latch is operable to latch the slave logic state to the slave storage node, the slave storage node providing the output of the sequential circuitry.

In another aspect of the present invention, each of the master and slave latches are static latches. They are configured with cross-coupled inverters such that the master storage operates as both the input and the output of the master storage latch.

In a further aspect of the present invention, an inverter is provided for inverting the master logic state on the master storage node to provide an inverted master logic state. This is input to a third transfer circuit substantially identical to the second transfer circuit that generates on the output thereof an inverse slave logic state in response to the second transition on the clock signal. This is output to an inverse slave storage node and is latched thereto with an inverse slave latch. The logic state on the inverse slave storage node comprises the inverse of the logic state on the slave storage node.

It is a technical advantage of the present invention that the Clock-to-Q time is reduced.

It is another technical advantage of the present invention that a minimal number of inversions are required from the input of the latch to the output of the latch.

It is a further technical advantage of the present invention in that the Clock-to-Q-Bar time is load independent of the Clock-to-Q time.

It is a yet further technical advantage of the present invention in that there is substantially no delay between the Clock-to-Q-Bar time and the Clock-to-Q time.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
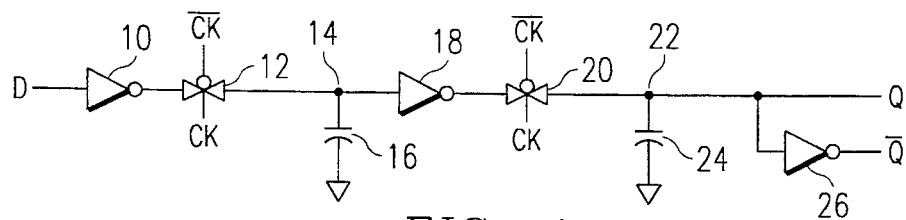
FIG. 1 illustrates a prior art dynamic flip-flop.

Referring now to FIG. 1, there is illustrated a logic diagram of a prior art dynamic flip-flop. A data input is provided to an input inverter 10, the output of which is connected to the input of a transfer gate 12. The transfer gate 12 is clocked by both the main CLOCK signal and a CLOCK-Bar signal such that it is opened on the leading edge of the clock to transfer the data. The output of the transfer gate 12 is connected to a master storage node 14, which master storage node 14 is connected to one plate of a storage capacitor 16. The other plate of the storage capacitor 16 is connected to the $V_{SS}$ reference voltage. The storage node 14 is connected to the input of a slave inverter 18, the output of which is connected to the input of a slave transfer gate 20. The slave transfer gate is clocked by the signals CLOCK and CLOCK-Bar such that it is turned on the positive edge of the CLOCK-Bar signal. The output of the transfer gate 20 is connected to a slave storage node 22, which slave storage node 22 is connected to the plate of a capacitor 24, the other plate thereof connected to the $V_{SS}$ reference voltage. The storage node 22 comprises the Q-output, with the Q-Bar output provided on the output of an inverter 26, the input thereof connected to the storage node 22.

The dynamic flip-flop provides a fairly fast CLOCK-to-Q time since the input signal need travel only through two inverters and two transfer gates to reach the slave storage node 22. However, the disadvantage to any type of dynamic system is that the storage time of the storage capacitors 16 and 24 is relatively short and requires refreshing. In operation, the transfer gate 12 is opened on the negative going edge of the clock signal such that the data is transferred through the inverter 10 onto the storage node 14 to change the logic state thereof. On the next edge of the clock, the positive going edge of the CLOCK-Bar signal, the transfer gate 12 is closed and the transfer gate 20 opened such that the data stored on storage node 14 is transferred to storage node 22 and stored with capacitor 24.

Figure 2:
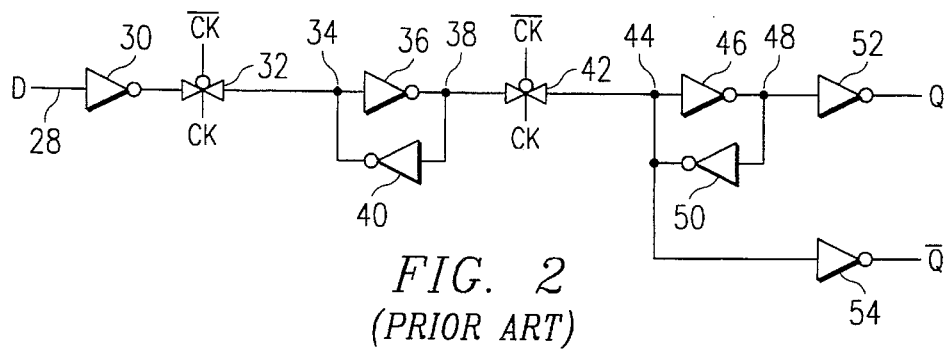
FIG. 2 illustrates a prior art static flip-flop.

Referring now to FIG. 2, there is illustrated a logic diagram of a prior art static flip-flop. The static flip-flop receives data on input 28 which is also the input to the inverter 30. The output of the inverter is connected to the input of transfer gate 32 clocked by the CLOCK signal and the CLOCK-Bar signal. The transfer gate 32 is typically comprised of a P-channel transistor and an N-channel transistor with the source/drain paths thereof connected in parallel with the gate of the N-channel transistor connected to the CLOCK signal and the gate of the P-channel transistor connected to the CLOCK-Bar signal. The output of transfer gate 32 is connected to a node 34, which is connected to one side of a cross-coupled inverter latch. The cross-coupled inverter latch is comprised of a first inverter 36 having the input thereof connected to the node 34 and the output thereof connected to a node 38. A second inverter 40 in the latch has the input thereof connected to the node 38 and the output thereof connected to the node 34. As such, whenever the logic signal on node 34 goes high, the output of inverter 36 goes low, pulling the input of inverter 40 low with the output of inverter 40 being overdriven. This logic state will remain on node 34 and on node 38 until the inverter 30 is operable to receive a different logic signal on the input 28 and, when transfer gate 32 is open, overdrive the output of inverter 40 to change the logic state thereof.

The output of inverter 36 on node 38 is input to a slave transfer gate 42 which is clocked by the CLOCK signal and the CLOCK-Bar signal such that the transfer gate 42 is opened on the positive going edge of the CLOCK-Bar signal. This is facilitated with parallel connected P-channel and N-channel transistors, with the gate of the N-channel transistor connected to the CLOCK-Bar signal and the gate of the P-channel transistor connected to the CLOCK signal. The output of transfer gate 42 is connected to a node 44 which is connected to a cross-coupled inverter latch. This is configured of a first inverter 46 with the input thereof connected to the node 44 and the output thereof connected to a node 48, and a second inverter 50, having the input thereof connected to node 48 and the output thereof connected to node 44. The node 48 represents a logic state that is passed through three inverters and, therefore, is the inverse of the data. Therefore, to provide the Q-output, the signal on node 48 must be passed through inverter 52 to provide a Q-output. The Q-Bar output is provided with an inverter 54 having the input thereof connected to the node 44 and the output thereof connected to the Q-Bar output.

The prior art flip-flop has a first disadvantage in that it requires the data to be transferred through two transfer gates and four inverters. Therefore, the CLOCK-to-Q time is a function of the delay through these logic devices. Additionally, the Q-Bar output is the result of processing data through the two transfer gates and through only three inverters. Therefore, the CLOCK-to-Q-Bar time is different than the CLOCK-to-Q time, since one less inverter is required.

Figure 2A:
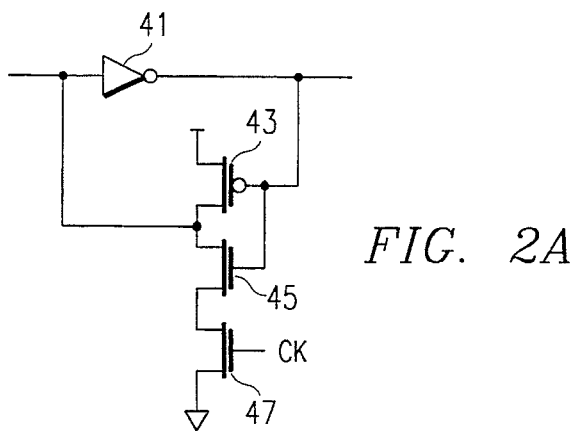
FIG. 2a illustrates a clocked latch.

Referring now to FIG. 2a, there is illustrated an embodiment of a "clocked" latch, which differs from the latches comprised of inverters 36 and 40 and 46 and 50 in that the output of, for example, inverter 40, does not have to be overdriven in order to change the state of latch. The clocked latch is comprised of an inverter 41, having an input and an output, the output connected to the gates of series connected transistors, a P-channel transistor 43 and an N-channel transistor 45, the source/drain paths thereof connected together. The other side of the source/drain path of P-channel transistor 43 is connected to the $V_{CC}$ terminal and the other side of the N-channel transistor 45 is connected to one side of the source/drain path of an N-channel transistor 47, the other side thereof connected to the $V_{SS}$ terminal. The gate of transistor 47 is connected to the clock signal. Therefore, whenever the clock signal is low, transistor 47 is non-conducting and the common source/drain paths of transistors 43 and 45 float and are connected to the input of inverter 41 such that, whenever the input of inverter 41 is driven, it does not need to be overdriven in order to set the latch. Therefore, the state that is presented to the input of inverter 41 prior to the clock signal going high is the state that is latched.

Figure 3:
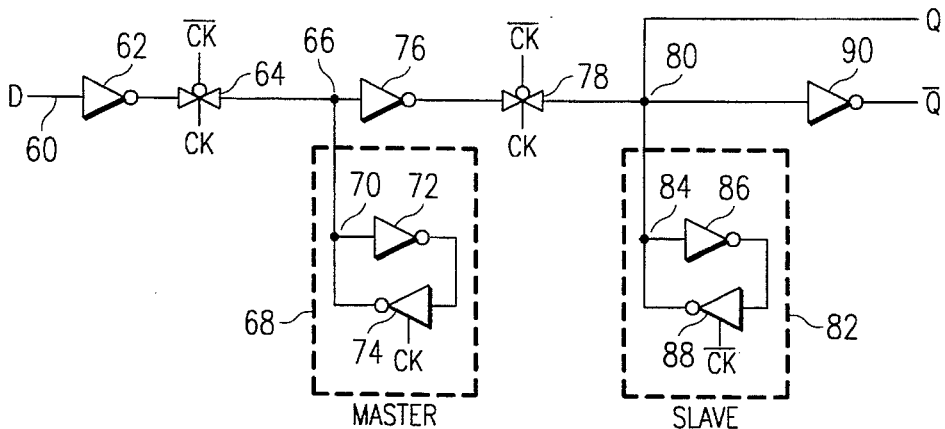
FIG. 3 illustrates a logic diagram of the flip-flop of the present invention.

Referring now to FIG. 3, there is illustrated a logic diagram of the high speed flip-flop of the present invention. Data is received on an input 60, which is connected to the input of an inverter 62, the output thereof connected to a master transfer gate 64. The transfer gate 64 is clocked by the CLOCK signal and the CLOCK-Bar signal. The output of transfer gate 64 is connected to a master storage node 66. The master storage node 66 is connected to one side of a master latch 68 on a node 70, node 70 being the same as node 66. The node 70 is connected on one side to the input of an inverter 72 and also to the output of a clocked inverter 74. The output of inverter 72 is connected to the input of inverter 74. Therefore, whenever the node 66 is driven high, this drives the output of inverter 72 low and forces the output of inverter 74 high, thus latching the logic state in the latch 68. However, the structure of FIG. 3 differs from that of the structure of FIG. 2 in that the storage node 66 provides not only the input to the latch 68, but also the output therefrom. This is connected through an inverter 76 to the input of a slave transfer gate 78, which is clocked with the signals CLOCK-Bar and CLOCK, similar to that of the transfer gate 42 in FIG. 2. The transfer gate 78 is open on the positive going edge of the CLOCK-Bar signal. The output of the transfer gate 78 is connected to a slave storage node 80, which is also connected to one side of a slave latch 82. This slave latch 82 is similar to the master latch 68, with the node 80 connected to a save latch node 84, node 84 connected to the input of an inverter 86 and to the output of a clocked inverter 88. Inverter 86 has the output thereof connected to the input of inverter 88 to provide a cross-coupled latch. Again, the node 80 provides the input to the latch 82 and also provides the output therefrom which provides the Q-output. The Q-Bar output is provided with an inverter 90 which has the input thereof connected to the node 80 and the output thereof providing the Q-Bar output.

In operation, data is input through the inverter 62 to the input of transfer gate 64, which is then passed therethrough on the negative going edge of the CLOCK signal for application to the node 66. The inverter 62 is designed such that it will overdrive the node 70 on the master latch 68 to change the logic state thereof. Thereafter, on the positive going edge of the CLOCK signal, the transfer gate 64 is turned off, the transfer gate 78 is clocked to latch the logic state in the master latch 68 and the transfer gate 78 is turned on pass the logic state on node 66 to the slave storage node 80. This is then stored in the latch 82 on the negative going edge of the CLOCK signal by clocking the inverter 88, with the inverter 76 being designed such that it will overdrive the latch 82. At this point in time, the Q-Bar output is valid. It can be seen that the Clock-to-Q time is dependent on only two transfer gates and two inverters and, therefore, is significantly faster than that of the prior art flip-flop. This has some similarities to the prior art dynamic flip-flop, with the exception that the latches 68 and 82 are static rather than dynamic and, thus, do not need to be refreshed.

In operation, the data is applied to the input of inverter 62 is inverted and applied to the input of the gate 64. On the negative going edge of the clock, transfer gate 64 is opened and the inverted logic state of the data is passed to the storage node 66 for storage in the static latch 68 on the next and positive going edge of the CLOCK signal. When the positive edge of the CLOCK signal occurs, the transfer gate 64 is closed, the slave transfer gate 78 is opened, the inverted logic state stored in the master latch 68 and also transferred to the slave storage node 80. Therefore, only two inverters are required in order to transfer the data from the input node 60 to the storage node 80, which is also the Q-output. Further, only a single transfer gate, transfer gate 78, is required to transfer the contents of latch 68 to the Q-output. This, therefore, results in a relatively fast Clock-to-Q time.

Figure 4:
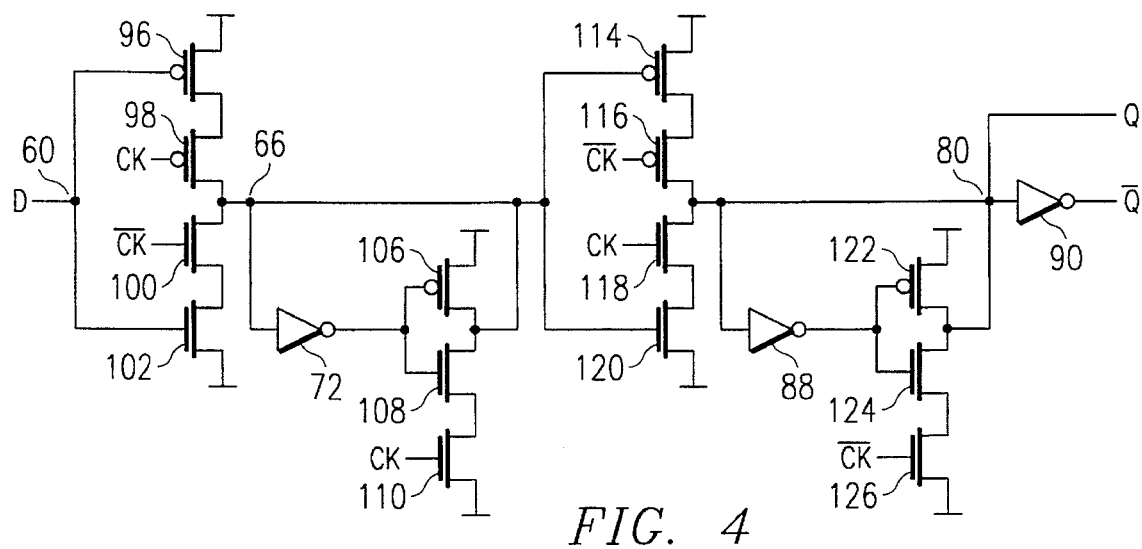
FIG. 4 illustrates a detailed schematic of the flip-flop of FIG. 3.

Referring now to FIG. 4, there is illustrated a schematic diagram of the flip-flop of FIG. 3. The inverter 62 and transfer gate 64 are realized with a three state inverter. The three state inverter is configured of two P-Channel transistors 96 and 98 and two N-channel transistors 100 and 102 connected together in a series configuration with the source/drain paths thereof connected in series. The P-channel transistor 96 has the source/drain path thereof connected between the $V_{DD}$ node and one end of the source/drain path of the P-channel transistor 98. The other end of the source/drain path of the P-channel transistor 98 is connected to the node 66 and also to one side of the source/drain path of the N-channel transistor 100. The other side of the source/drain path of N-channel transistor 100 is connected to one side of the source/drain path of N-channel transistor 102. The other side of the source/drain path of N-channel transistor 102 is connected to the $V_{SS}$ node. The gates of transistors 96 and 102 are connected together and to the node 60. The gate of transistor 98 is connected to the clock signal and the gate of transistor 100 is connected to the CLOCK-Bar signal. In operation, when the data node 60 goes high, transistor 102 is turned on and transistor 96 turned off. Transistor 98 is turned on when the CLOCK signal is low and transistor 100 is turned on when the CLOCK-Bar signal is high. Therefore, the data on node 60 is transferred directly to the master storage node 66 on the negative going edge of the CLOCK. When the CLOCK signal goes high at the positive going edge thereof, transistor 98 is turned off and transistor 100 is turned off, thereby isolating the master storage node 66 from the data node 60.

The master latch 68 is configured with the inverter 72 having the output thereof connected to the gates of two series-connected transistors, a P-channel transistor 106 and an N-channel transistor 108. P-channel transistor 106 has a source/drain path thereof connected between the $V_{DD}$ node and the master storage node 66 and the N-channel transistor 108 has a source/drain path thereof connected between the master storage node 66 and one side of the source/drain path of an N-channel transistor 110. The other side of the source/drain path of the transistor 110 is connected to the $V_{SS}$ node and the gate thereof is connected to the CLOCK signal such that the latch 68 is activated on the positive going edge of the CLOCK.

The transistors 96–102 are sized relative to the transistor 108 such that they are larger and can overpower the transistor 108. Transistors 96 and 98 have a length of 1 μm and a width of 6.4 μm. Similarly, transistors 100 and 102 have a length of 1 μm and a width of 9 μm. Transistor 106 has a width of 2.1 μm and transistor 108 has a width of 3.2 μm, with transistor 110 having a width of 2.5 μm. Therefore, if node 66 is at a high logic state and node 60 is pulled high, this will cause transistors 100 and 102 to pull node 66 low. Since transistors 100 and 102 are larger transistors than transistor 106, the node 66 will be pulled low. When the CLOCK signal goes high, transistors 98 and 100 are turned off and transistor 110 is turned on, storing the logic state in the latch.

The inverter 76 and pass gate 78 are realized with four series connected transistors, two P-channel transistors 114 and 116 and two N-channel transistors 118 and 120. Transistor 114 has a source/drain path thereof connected between the $V_{DD}$ node and one side of the source/drain path of transistor 116, the other side of the source/drain path of transistor 116 connected to the slave storage node 80. Transistor 118 has the source/drain path thereof connected between node 80 and one side of the source/drain path of transistor 120, the other side thereof connected to the $V_{SS}$ node. The gates of transistors 114 and 120 are connected to the master storage node 66, the gate of transistor 116 connected to the CLOCK-Bar signal and the gate of transistor 118 connected to the CLOCK signal. Therefore, the data on the master storage node 66 is transferred to the slave storage node 80 whenever the CLOCK signal goes high and the CLOCK-Bar signal goes low, i.e., on the positive going edge of the CLOCK signal. The slave latch 82 is configured with the inverter 88 driving the gates of two series-connected transistors, a P-channel transistor 122 and an N-channel transistor 124, the P-channel transistor 122 having the source/drain path thereof connected between the $V_{DD}$ node and the storage node 80, and the source/drain path of transistor 124 connected between storage node 80 and one side of the source/drain path of an N-channel transistor 126. The other side of the source/drain path of transistor 126 is connected to the $V_{SS}$ node and the gate thereof is connected to the CLOCK-Bar signal. The node 80 provides the Q-output with the Q-Bar output provided on the output of inverter 90 connected between node 80 and the Q-Bar output.

In operation, the data node 60 is transferred to the node 66 on the negative going edge of the CLOCK signal. On the occurrence of the positive going edge of the CLOCK signal, the data stored in the master latch 68 and transferred from the master storage node 66 to the slave storage node 80. There is a first procedure, the setup procedure, that involves the condition wherein the clock signal is low, during this condition, transistor 98 is turned on and transistor 100 is turned on, such that transistors 96 and 100 allow transistors 96 and 102 in addition to the logic state on node 60 to determine the logic state on node 66. In this mode, the transfer gate 64 is "transparent". Similarly, transistors 114 and 120 have the gates thereof connected to the logic signal on node 66 such that a "low" logic state on node 66 will force the gate of transistor 114 low or a "high" logic state on node 66 will force the gate of transistor 120 high. During this time, the gates of transistors 106 and 108 are pulled either high or low, but transistor 110 does not conduct. During the next period, the transfer period, the clock signal is pulled high, turning transistors 98 and 100 off and isolating node 66 from node 60, this being the isolation state of the transfer gate 64. At the same time, transistors 116 and 118 are turned on to transfer the logic state stored in the latch 68, comprised of transistors 106, 108 and 110 and inverter 72, over to the node 80. During this period, transistor 126 is turned off such that the latch 82, comprised of transistors 122, 124, 126 and inverter 88 is not "clocked". When the clock signal again goes low, the logic state on node 80 is latched into the slave latch 82. Therefore, only a single transfer gate is required to perform the transfer operation from the master latch 68 to the slave latch 82 during the transfer period.

Figure 5:
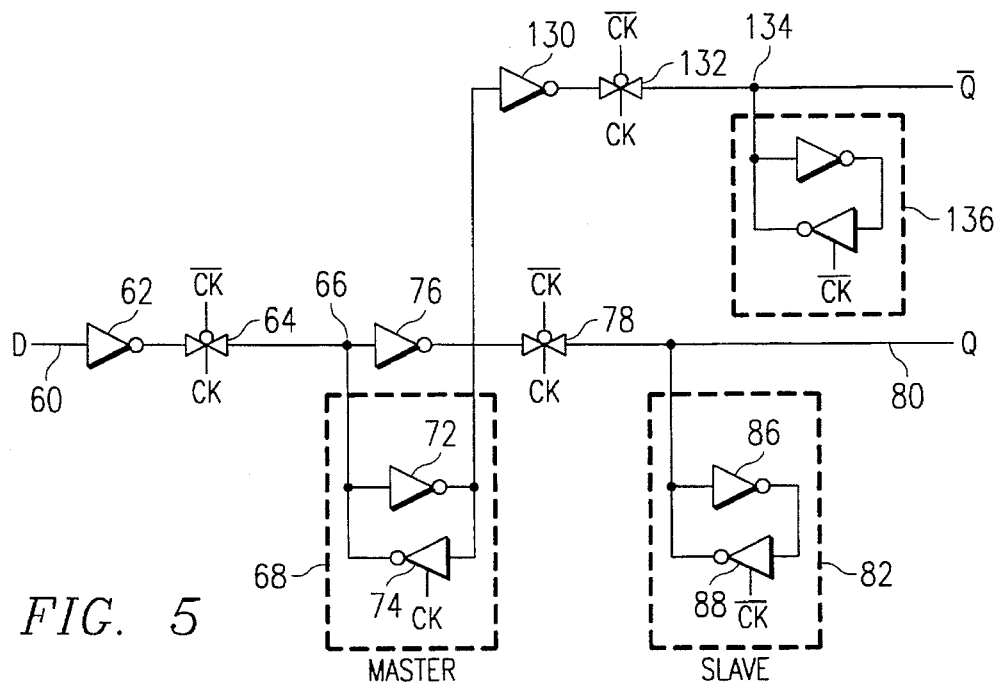
FIG. 5 illustrates a logic diagram of an alternate embodiment of the flip-flop of FIG. 3.

Referring now to FIG. 5, there is illustrated an alternate embodiment of the present invention. The Q-Bar output from the inverter 90 of the embodiment of FIG. 4 is affected by the load on the storage node 80 in that the transistors 114 and 116 or transistors 118 and 120 drive node 80, whereas the Q-Bar output node is driven by the transistors that are utilized to realize the inverter 90. As such, in a load on the Q-output and the slave storage node will cause the CLOCK-to-Q output delay to change and this will be directly reflected through to the Q-Bar output. In order to isolate the operation of these two outputs and also to remove the delay inherent in the inverter 90, a second slave stage is added. A second slave inverter 130 is provided having the output thereof connected to a slave transfer gate 132. Inverter 130 and transfer gate 132 are identical to inverter 76 and transfer gate 78, which is described hereinabove with reference to FIG. 4 as encompassing the transistors 114–120. The input of inverter 130 is connected to the intermediate node between the output of inverter 72 and the input of inverter 74 in the master latch 68. The inverter 72 ensures that the logic state on the input of inverter 130 is the inverse of the logic state on the master storage node 66. The output of transfer gate 132 is connected to a Q-Bar storage node 134. Attached to the Q-Bar storage node 134 is a cross-coupled latch 136, similar to the cross-coupled latch 82. The storage node 132 comprises the Q-Bar output. It can be seen that the operation of the storage node 134 is isolated from the operation of the storage node 80. Since the setup time takes into account any delay through inverter 130, the delay of the data through either the transfer gate 78 or the transfer gate 132 is the same. As such, the clock-to-Q and clock-to-Q-Bar delay is the same.

Figure 6:
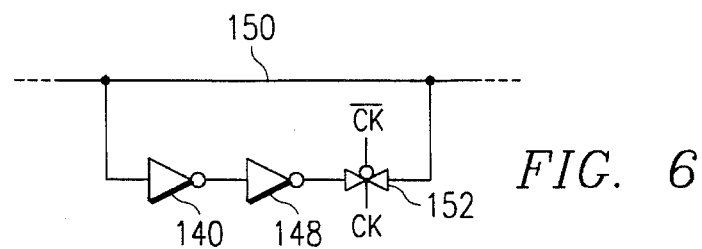
FIG. 6 illustrates an alternate embodiment for realizing the latch structure of the embodiment of FIG. 3.

Referring now to FIG. 6, there is illustrated a logic diagram of an alternate cross-coupled latch that is clocked. This cross-coupled latch utilizes two series connected inverters 140 and 148 connected together, with the input of inverter 148 connected to the output of inverter 140. The input of inverter 140 is connected to a storage node 150 and the output of inverter 148 is connected to one side of a transfer gate 152, the other side of transfer gate 152 connected to the node 150. Transfer gate 152 is clocked by the CLOCK signal and the CLOCK-Bar signal, this transfer gate 152 realized with parallel-connected P-channel and N-channel transistors.

In summary, there has been provided a high speed flip-flop that utilizes a master stage and a slave stage. The master stage is configured with a single inverter and transfer gate that transfers data from an input node to a master storage node. A data holder or cross-coupled latch is connected to the master storage node such that the master storage node provides both the input and the output of the data holder or cross-coupled latch. This master storage node is connected directly to the input of a slave stage which is configured with an inverter and transfer gate that is operable to transfer the data on the master storage node to a slave storage node upon the positive going edge of a clock signal, the transfer gate on the input to the master storage node isolating the data node from the master storage node on the positive going edge of the clock. A data holder or cross-coupled latch is disposed on the slave storage node such that the slave storage node acts as the input and output of the data holder, the slave storage node comprising the Q-output of the flip-flop.

Although the preferred embodiment has been described in detail, it should be understood that various changes, substitutions and alterations can be made therein without departing from the spirit and scope of the invention as defined by the appended claims.

What is claimed is:

1. Sequential circuitry for latching a logic state in response to a clock signal, comprising:

an input node for receiving an input signal having an input logic state;

a master storage node for storing a master logic state;

a single slave storage node for storing a slave storage logic state;

first transfer circuitry coupled to said input node for outputting the master logic state representative of the inverse of said input logic state to said master storage node in response to a first transition of the clock signal;

a master latch for latching said master logic state to said master storage node;

second transfer circuitry coupled to said master storage node for transferring the slave logic state representative of the inverse of said master logic state to said single slave storage node in response to a second transition of the clock signal;

a slave latch for latching said slave logic state to said single slave storage node;

an inverter having the input thereof connected to a node within said master latch, said inverter for outputting a logic state representative of the logic state on said master storage node;

third transfer circuitry substantially identical to said second transfer circuitry coupled to the output of said inverter for outputting a logic state representative of said master logic state to a single inverse slave storage node, said third transfer circuitry operating in response to said second transition of the clock signal; and an inverse slave latch substantially identical to said slave latch for latching said inverse master logic state to said single inverse slave storage node.

2. The sequential circuitry of claim 1, wherein said master latch is operable to latch said master logic state to said master storage node in response to the second transition of the clock signal.

3. The sequential circuitry of claim 1, wherein said slave latch is operable to latch said slave logic state to said single slave storage node in response to the first transition of the clock signal.

4. The sequential circuitry of claim 1, wherein said first transfer circuitry comprises a three state inverter with an input and an output, the input operable to receive said input signal and the output thereof connected to said master storage node, said three state inverter operating in response to the first transition of the clock signal to generate the master logic state which is the inverse of said input signal for application to said master storage node.

5. The sequential circuitry of claim 1, wherein said second transfer circuitry comprises a three state inverter with an input and an output, the input connected to said master storage node and the output thereof connected to said single slave storage node, said three state inverter operating in response to the second transition of the clock signal to generate the slave logic state which is the inverse of the master logic state for application to said single slave storage node.

6. The sequential circuitry of claim 1, wherein said master latch and slave latch each comprise a static latch.

7. The sequential circuitry of claim 6, wherein said static latch for each of said master and slave latches comprises cross-coupled inverters wherein one of said cross-coupled inverters is clocked by the respective one of said first and second transitions of the clock signal.

8. The sequential circuitry of claim 1, wherein said first transition of the clock signal comprises a transition from a high logic level to a low logic level.

9. The sequential circuitry of claim 1:
wherein said master storage node comprises a single master storage node.

10. The method for latching a logic state in response to the generation of transitions in a clock signal, comprising the steps of;
inputting an input signal having an input logic state to an input node;
transferring a master logic state that represents the input logic state to at least one master storage node, the step of transferring operating in response to a first transition of the clock signal;
latching the master logic state to the master storage node;
transferring a slave logic state representative of the master logic state to a single slave storage node in response to a second transition of the clock signal;
latching the slave logic state to the single slave storage node;
transferring an inverse slave logic State representative of the complement of the master logic state to an inverse slave storage node in response to said second transition of the clock signal:
latching the inverse slave logic state to the inverse slave storage node;
outputting the slave logic state on the slave storage node to a first output: and
outputting the inverse slave logic state on the slave storage node to a second output.

11. The method of claim 10, wherein the step of latching the master logic state to at least one master storage node comprises latching the master logic state to the master storage node in response to a second transition of the clock signal.

12. The method of claim 10, wherein the step of latching the slave logic state to the single slave storage node comprises, latching the salve logic state to the single slave storage node in response to the first transition of the clock signal.

13. The method of claim 10, wherein the step of latching the master logic state to at least one master storage node comprises latching the master logic state to the master storage node with a static latch.

14. The method of claim 10, wherein the step of latching the slave logic state to the single slave storage node comprises latching the slave logic state to the single slave storage node with a static latch.

15. The method of claim 10, wherein the first transition of the clock signal comprises a transition from a high logic level to a low logic level.

16. The method of claim 10, wherein the step of transferring a master logic state is operable to transfer the input logic state to a single master storage node and wherein the step of latching the master logic state is operable to latch the master logic state to the single master storage node.

17. The sequential circuitry of claim 1 wherein said sequential circuit has an output which comprises said single slave logic node.

18. The sequential circuitry of claim 8 wherein said second transition of the clock signal comprises a transition from a low logic level to a high logic level.

19. A memory device comprising:
an inverter having an input and an output;
a p-channel transistor having a gate, a source and a drain wherein said gate is coupled to the output of said inverter, wherein said source is coupled to a first voltage supply and said drain is coupled to the input of said inverter;
a first n-channel transistor having a gate, a source and a drain wherein said drain is coupled to the drain of said p-channel transistor and said gate is coupled to the gate of the p-channel transistor; and
a second n-channel transistor having a gate, a source and a drain wherein said drain is coupled to the source of said first n-channel transistor, said source is coupled to a second voltage supply and said gate is coupled so as to receive an enable signal.

20. Sequential circuitry for latching a logic state in response to a clock signal, comprising:
an input node for receiving an input signal having an input logic state;
a master storage node for storing a master logic state;
a slave storage node for storing a slave logic state;
first transfer circuitry coupled between said input node and said master storage node;
a master latch coupled to said master storage node, said master latch comprising:
an inverter having an input and an output;
a p-channel transistor having a gate, a source and a drain wherein said gate is coupled to the output of said inverter, wherein said source is coupled to a first voltage supply and said drain is coupled to the input of said inverter;
a first n-channel transistor having a gate, a source and a drain wherein said drain is coupled to the drain of said p-channel transistor and said gate is coupled to the gate of said p-Channel transistor; and
a second n-channel transistor having a gate, a source and a drain wherein said drain is coupled to the source of said first n-channel transistor, said source is coupled to a second voltage supply and said gate is coupled so as to receive said clock signal;
second transfer circuitry coupled between said master storage node and said slave storage node; and
a slave latch coupled to said slave latch node.

21. The sequential circuitry of claim 20 wherein said first transfer circuitry and said master latch are clocked by a first clock signal and wherein said second transfer circuitry and said slave latch are clocked by a second clock signal.

22. The sequential circuitry of claim 21 wherein said first clock signal is a complementary signal of said second clock signal.

23. The sequential circuitry of claim 22 wherein said first transfer circuitry comprises a three-state inverter.

24. The sequential circuitry of claim 20 wherein said first transfer circuitry comprises an inverter coupled in series with a transmission gate.

25. Sequential circuitry for latching a logic state in response to an enable signal, comprising:

an input node for receiving an input signal having an input logic state;

a master storage node for storing a master logic state;

a slave storage node for storing a slave logic state;

first transfer circuitry coupled between said input node and said master storage node;

a master latch coupled to said master storage node;

second transfer circuitry coupled between said master storage node and said slave storage node; and a slave latch coupled to said slave latch node, said slave latch comprising:

an inverter having an input and an output;

a p-channel transistor having a gate, a source and a drain wherein said gate is coupled to the output of said inverter, wherein said source is coupled to a first voltage supply and said drain is coupled to the input of said inverter;

a first n-channel transistor having a gate, a source and a drain wherein said drain is coupled to the drain of said p-channel transistor and said gate is coupled to the gate of the p-channel transistor; and a second n-channel transistor having a gate, a source and a drain wherein said drain is coupled to the source of said first n-channel transistor said source is coupled to a second voltage supply, and said gate is coupled so as to receive said enable signal.

26. A master slave flip-flop comprising:

an input node;

a master storage node;

an output node;

first transfer circuitry coupled between said input node and said master storage node for transferring a logic state present at said input node to said master storage node upon receipt of a first clock signal;

a master latch for latching a master logic state to said master storage node;

second transfer circuitry with an input coupled to said master storage node and an output coupled directly to said output node wherein said second transfer circuitry transfers said master logic state to said output node upon receipt of a second clock signal said second transfer circuitry comprising a transmission gate; and a slave latch for latching said master logic state to said output node upon receipt of said clock signal, said slave latch comprising a static latch.

27. The flip-flop of claim 26 wherein said second transfer circuitry further comprises an inverter with an output coupled to an input of said transmission gate.

\* \* \* \* \*